US006407684B1

(12) United States Patent
Schmidt

(10) Patent No.: US 6,407,684 B1
(45) Date of Patent: Jun. 18, 2002

(54) METHOD AND DEVICE FOR ESTIMATING THE FREQUENCY OF A DIGITAL SIGNAL

(75) Inventor: Kurt Schmidt, Grafing (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 09/901,644

(22) Filed: Jul. 11, 2001

(30) Foreign Application Priority Data

Jul. 11, 2000 (DE) .................................... 100 33 575

(51) Int. Cl.[7] .............................................. H03M 1/48
(52) U.S. Cl. ................ 341/111; 341/116; 341/155; 370/212; 370/276; 370/284; 370/516; 375/347; 375/267; 375/350
(58) Field of Search .............................. 341/111, 116

(56) References Cited

U.S. PATENT DOCUMENTS

| | | | | |
|---|---|---|---|---|
| 3,766,545 A | * | 10/1973 | Hikosaka | 341/111 |
| 3,789,393 A | * | 1/1974 | Tripp | 341/111 |
| 5,134,397 A | * | 7/1992 | Eyerly et al. | 341/111 |
| 5,754,130 A | * | 5/1998 | Sakayori | 341/111 |
| 5,835,390 A | | 11/1998 | Trager | 708/313 |
| 5,907,298 A | * | 5/1999 | Kiriyama et al. | 341/111 |
| 6,049,297 A | * | 4/2000 | Ducharme et al. | 341/111 |
| 6,229,471 B1 | * | 4/2001 | Goode et al. | 341/111 |
| 6,236,343 B1 | * | 5/2001 | Patapoutian | 341/111 |

FOREIGN PATENT DOCUMENTS

| | | | |
|---|---|---|---|
| DE | A1-4-302679 | 8/1994 | G01R/23/02 |
| DE | A1-19-534262 | 3/1996 | G01R/29/06 |
| DE | A1-19-516449 | 11/1996 | H04B/17/00 |
| DE | A1-19-808874 | 9/1999 | H04L/27/00 |

OTHER PUBLICATIONS

Chu, IEEE Transactions on Circuits, and Systems, vol. CAS–31, No. 11, pp. 913–924 (1984).
Wolf, IEEE Transactions on Communications, vol. 38, No. 1, pp. 124, (1990).
Hagiwara et al., Electronics and Communications in Japan, vol. 67–B, No. 10, pp. 66–74 (1984).

* cited by examiner

*Primary Examiner*—Michael Tokar
*Assistant Examiner*—Lam T. Mai
(74) *Attorney, Agent, or Firm*—Birch, Stewart, Kolasch & Birch

(57) ABSTRACT

A frequency estimator for estimating the frequency of a digital input signal (x(k)) includes a phase detection device (2) for determining the phase ($\phi(k)$) of the input signal (x(k)), a differentiator (3) for generating the phase difference ($\phi_{diff1}(k)$) between adjacent samples of the phase ($\phi(k)$, $\phi(k-1)$) and a filter (4) for averaging the phase difference ($\phi_{diff}(k)$) and having a trapezoidal pulse response ($h_M(k)$). The trapezoidal pulse response ($h_M(k)$) is generated by superimposing a first triangular pulse response with a second triangular pulse response which is offset in time with respect to the first triangular pulse response.

8 Claims, 4 Drawing Sheets

METHOD AND DEVICE FOR ESTIMATING THE FREQUENCY OF A DIGITAL SIGNAL

This patent application claims priority of German Patent Application No. 100 33 575.6, filed on Jul. 11, 2000. The entire contents of the German Patent Application are hereby incorporated by reference.

BACKGROUND OF THE INVENTION

1. Field of the Invention

This invention relates to a method and a device for estimating the frequency of a digital signal.

2. Related Art

A method for frequency estimation is disclosed by J. K. Wolf and J. W. Schwartz in "Comparison of Estimators for Frequency Offset," IEEE Transactions on Communications, vol. 38, no. 1, January 1990, pages 124–127. In this article, it is proposed that the phase of the complex digital input signal be differentiated and the differentiated phase be sent to an averaging filter. It is demonstrated in this article that the ideal pulse response of the averaging filter is parabolic. The parabolic curve of the pulse response of the averaging filter can be approximated relatively well by a trapezoidal curve with an increasing range, a constant range and a descending range. The standard deviation of the estimation error increases by only about 6% in comparison with the use of an ideal averaging filter with a parabolic pulse response. Therefore, this can be called a suboptimal frequency estimator.

If the filter with a trapezoidal pulse response mentioned in the article cited above were to be implemented directly, a relatively large number of multiplications would have to be performed because each sample within the observation interval would have to be multiplied by a corresponding coefficient.

SUMMARY OF THE INVENTION

Therefore, the object of the present invention is to provide a method and a device for estimating the frequency of a digital input signal, where the trapezoidal pulse response of the averaging filter is generated easily, preferably without a gate-intensive multiplier.

This object is achieved with regard to the method by the features of claim 1 and with regard to the device by the features of claim 6. Advantageous refinements of this invention are characterized in the subordinate claims.

The present invention makes use of the finding that the trapezoidal pulse response can be generated by superimposing two time-offset triangular pulse responses. Triangular pulse responses can be generated by folding two square-wave pulse responses, where the second triangular pulse response which is offset in time with respect to the first triangular pulse response can be generated by folding with a Dirac pulse. Square-wave pulse responses can be generated by a combination of an integrator and a differentiator, where the differentiator has a reduced sampling rate whose sampling period corresponds to the period of the square-wave pulse response, i.e., one third of the observation period. Therefore, the differentiator subtracts the initial value of the integrator from the end value of the integrator. The amplitude of the square-wave pulse response corresponds to one third of the resulting trapezoidal pulse response.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
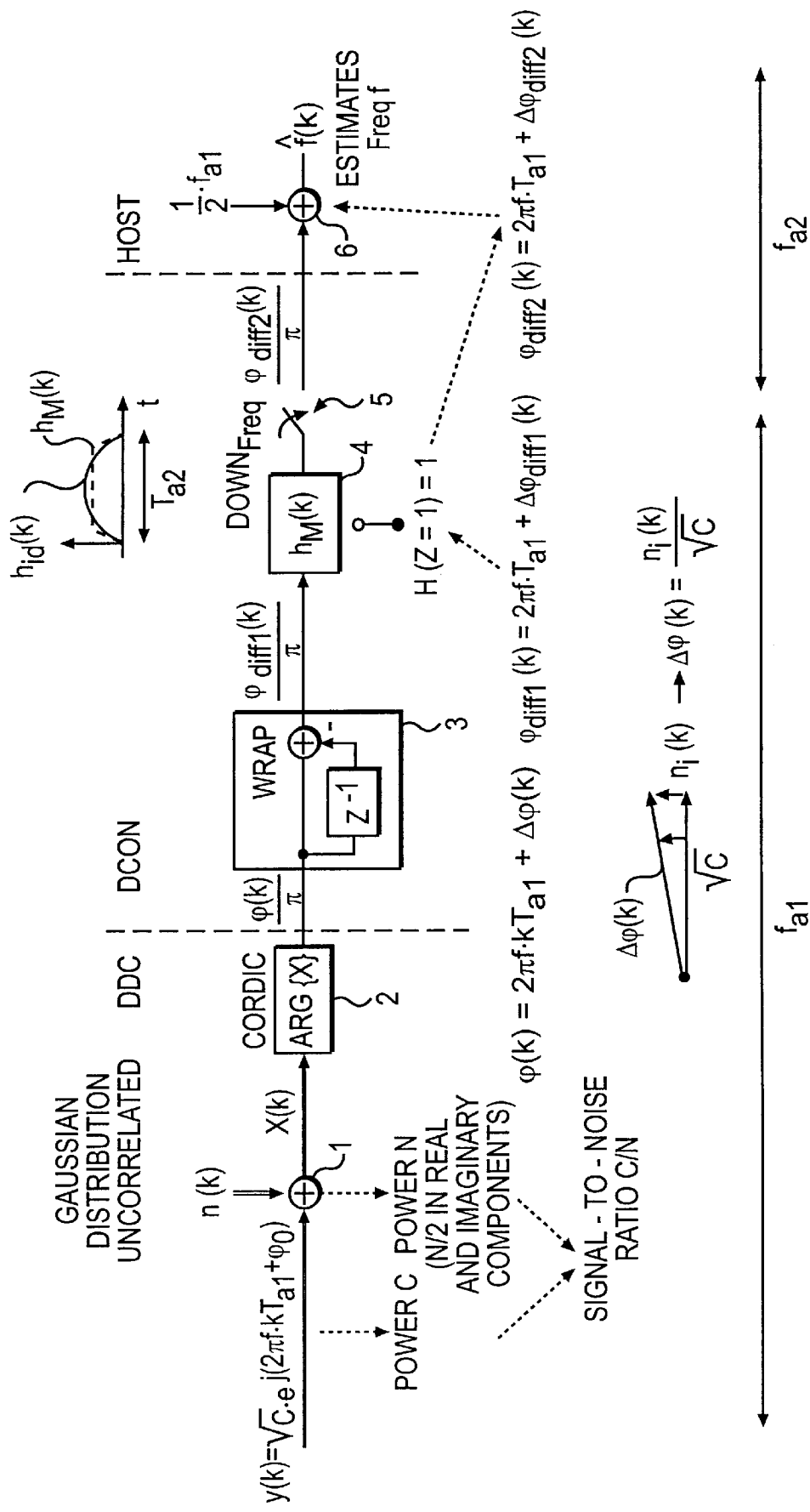
FIG. 1 is a block diagram of an embodiment of the frequency estimator according to the present invention.

FIG. 1 shows a block diagram of an embodiment of the frequency estimator according to the present invention. Let it be assumed that the digital input signal x(k) is composed of a noise-free input signal y(k), where $$y(k) = \sqrt{C} \cdot e^{j(2\pi f \cdot kT_{a1} + \phi_0)} \quad (1)$$

and an uncorrelated noise signal n(k) with a Gaussian distribution by addition in an adder 1. In equation (1), f denotes the frequency to be estimated, k is the counting index for the samples, $T_{a1}$ is the sampling period and $\phi_0$ is a constant phase shift.

The noise-free component y(k) has a power C and the noise component n(k) has a power N, with N/2 for the real component and N/2 for the imaginary component. The signal-to-noise ratio is thus C/N.

The input signal x(k) is sent to a phase detection device 2 which determines the phase component of the complex signal x(k) by using the arg function. Phase $\phi(k)/\pi$ standardized to $\pi$ is available at the output of the phase detection device 2. The difference between two adjacent samples $\phi(k)/\pi$ and $\phi(k-1)/\pi$ of the phase is calculated in a downstream differentiator 3. A differentiator with wrap arithmetic can be used here, its value range being between −1 and 1, so that $2\pi$ phase shifts are corrected automatically. The phase difference values $\phi_{diff1}(k)/\pi$ which are generated at the output of differentiator 3 are sent to a filter 4 which has a pulse response $h_M(k)$ and is described in greater detail below. Above filter 4, the ideal pulse response $h_{id}(k)$ of filter 4 is shown with an unbroken line. A trapezoidal pulse response $h_M(k)$ of a filter 4 approximating it as used within the scope of this invention is shown with a broken line. In filter 4, the phase difference values $\phi_{diff1}(k)/\pi$ are averaged over an observation period $T_{a2}$ taking into account the weighting that results from the pulse response h(k). Weighting is performed over a predetermined number of samples (e.g., 60 in FIGS. 3 and 4).

After the observation period $T_{a3}$ an averaged phase difference value $\phi_{diff2}(k)/\pi$ is to be output. Therefore, in a sample converter 5, the samples are reduced by the ratio of the observation period $T_{a2}$ to the sampling period $T_{a1}$. This is appropriate because otherwise the estimation errors would correlate with one another. This is also indicated in FIG. 1 by working with a sampling rate or clock frequency of $f_{a1}=1/T_{a1}$ in the sample converter 5 and with a sampling rate or clock frequency of $f_{a2}=1/T_{a2}$ after the sample converter 5.

Phase difference values $\phi_{diff1}(k)/\pi$ standardized to $\pi$ that are available at the output of the sample converter 5 differ from the frequency f to be estimated by the factor $1/(2 \cdot T_{a1})$ or $\frac{1}{2} f_{a1}$. Therefore, it must be multiplied by a constant factor $\frac{1}{2} f_{a1}$ in a multiplier 6 to provide the estimates $\hat{f}(k)$.

The present invention relates to an improvement in the arithmetic of filter 4. Before discussing the arithmetic in greater detail on the basis of FIG. 2, the basic concept will first be explained on the basis of FIGS. 3–7.

In the article by J. K. Wolf and J. W. Schwartz "Comparison of Estimators for Frequency Offset," IEEE Transactions on Communications, vol. 38, no. 1, January 1990, pages 124–127, it is shown that the filter 4 must have the following ideal pulse response $h_{id}(k)$ for a so-called maximum likelihood estimator, i.e., a frequency estimator in which the variance of the phase error $\Delta_{\phi diff2}(k)$ is optimally low:

$$h_{id}(k) = \frac{6k \cdot (Down_{Freq} - k)}{(Down_{Freq} - 1) \cdot Down_{Freq} \cdot (Down_{Freq} + 1)} \quad (2)$$

where $Down_{Freq}=f_{a1}/f_{a2}$.

Figure 3:
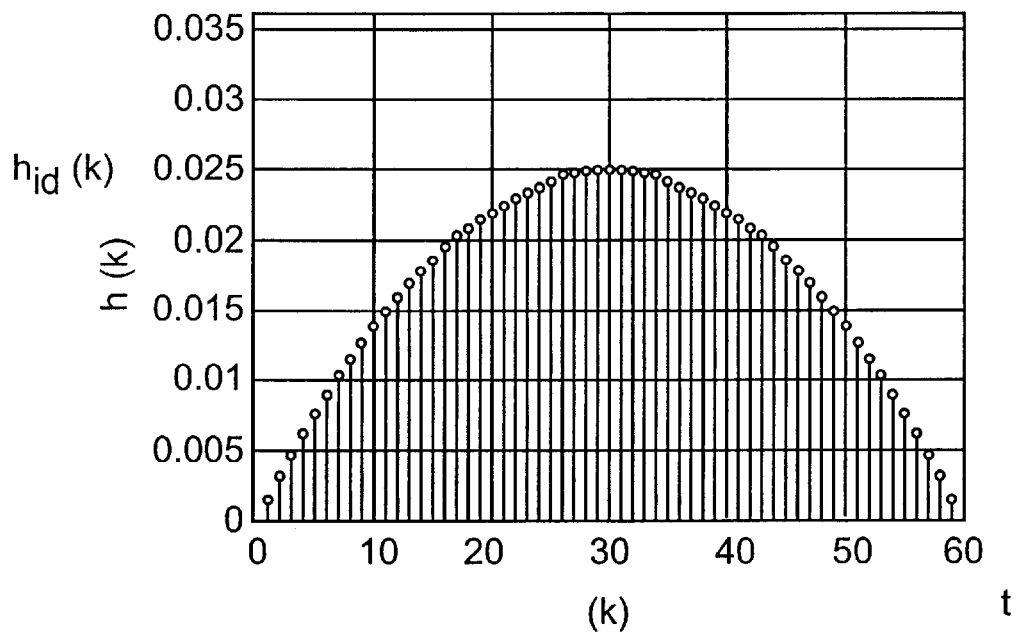
FIG. 3 is the ideal pulse response of the averaging filter.

This ideal pulse response $h_{id}(k)$ is shown graphically in FIG. 3 for the observation period $T_{a2}=60 \cdot T_{a1}$. This yields a parabolic curve of the pulse response $h_{id}(k)$.

Figure 4:
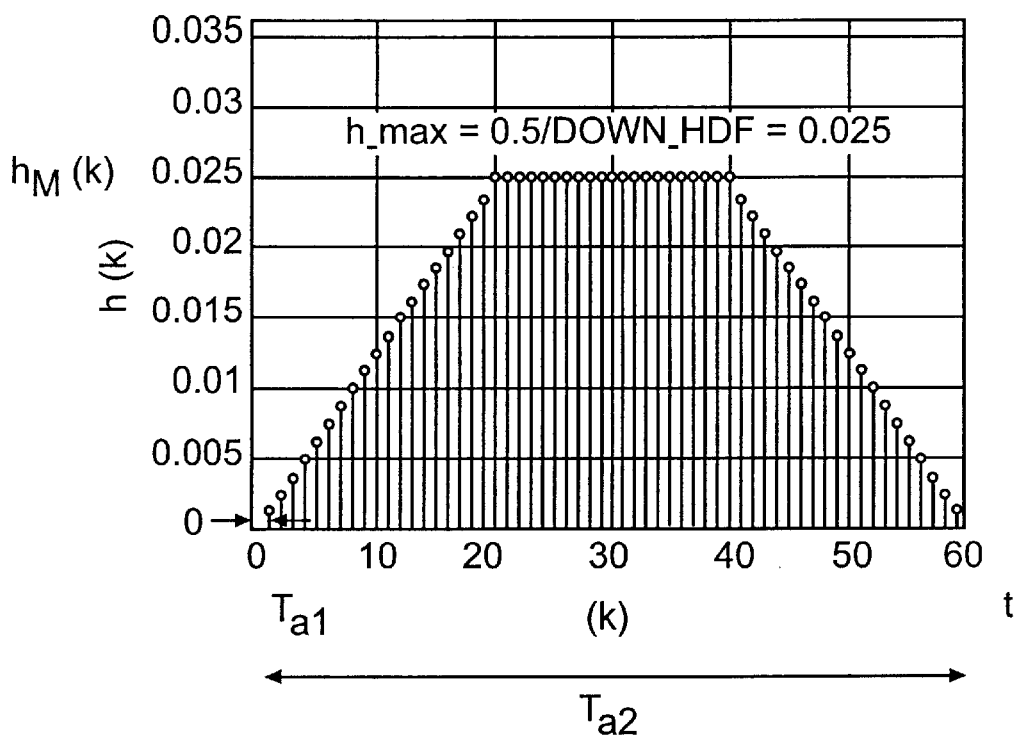
FIG. 4 is the approximated trapezoidal pulse response of the averaging filter.

A direct implementation of equation (2) requires a considerable gate complexity. It is therefore proposed in the article cited above that the ideal pulse response $h_{id}(k)$ shown in FIG. 3 be approximated by a trapezoidal pulse response $h_M(k)$ as shown in FIG. 4. The approximated pulse response $h_M(k)$ is as follows:

$$h_m(k)=\text{const} \cdot \lfloor \delta_{-1}(k) - \delta_{-1}(k - Down_{Freq}/3) \rfloor * \lfloor \delta_{-1}(k) - \delta_{-1}(k - 2 \cdot Down_{Freq}/3) \rfloor \quad (3)$$

where $\delta_{-1}$ is the jump function. When using this pulse response $h_M(k)$ a suboptimal frequency estimator is obtained, where the standard deviation of the estimation error is only approx. 6% greater in comparison with a frequency estimator using a filter with the ideal pulse response $h_{id}(k)$ shown in FIG. 3, so that almost the optimum frequency estimate $\hat{f}$ which is theoretically possible is achieved.

A direct implementation of equation (3) is still associated with a considerable gate complexity because of the numerous multiplications required, making the implementation of the hardware difficult under realtime conditions. This is where the present invention begins by proposing a simple method of generating the trapezoidal pulse response $h_M(k)$ illustrated in FIG. 4.

Figure 5:
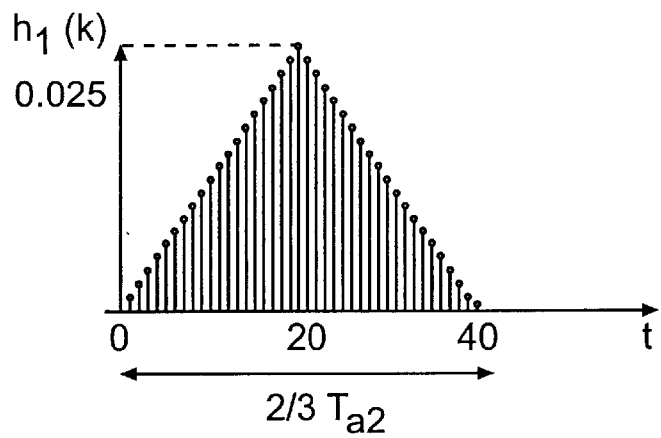
FIGS. 5 and 6 are two time-offset triangular pulse responses for generation of the trapezoidal pulse response shown in FIG. 1.
Figure 6:
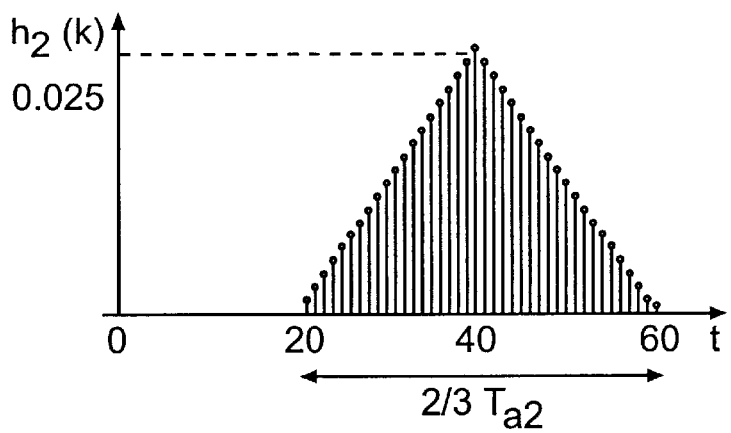

It is proposed according to the present invention that the trapezoidal pulse response $h_M(k)$ shown in FIG. 4 be generated by superimposing two triangular pulse responses $h_1(k)$ and $h_2(k)$ of the length $\frac{2}{3} T_{a2}$ as shown in FIGS. 5 and 6. The second triangular pulse response $h_2(k)$ is offset by $\frac{1}{3} T_{a2}$ in comparison with the first triangular pulse response $h_1(k)$, so that the trapezoidal pulse response $h_M(k)$ shown in FIG. 4 is obtained by adding these two pulse responses. The time offset and the addition of the second triangular pulse response $h_2(k)$ and the first triangular pulse response $h_1(k)$ can be generated by folding with a Dirac pulse by using a suitable averaging filter.

Figure 7:
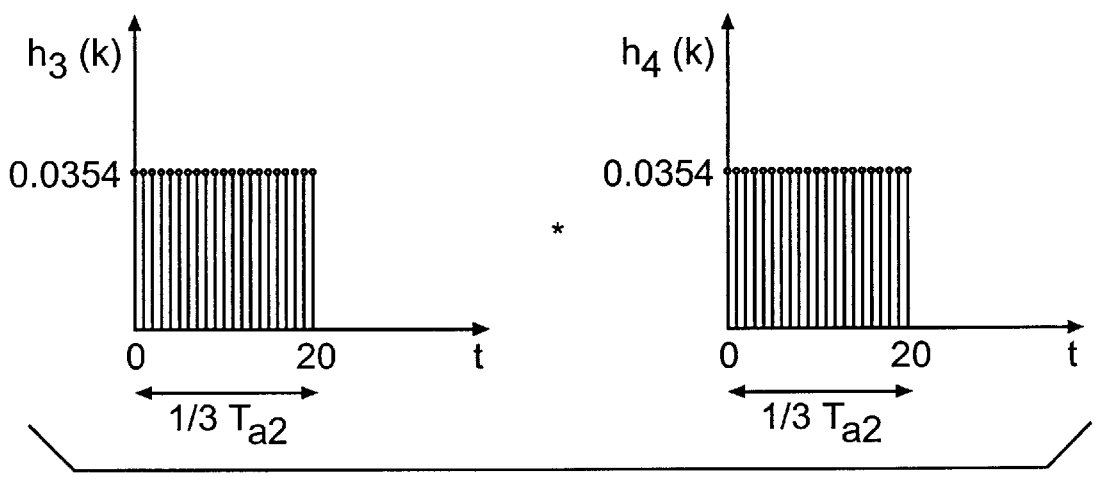
FIG. 7 is two square-wave pulse responses whose folding yields the triangular pulse response shown in FIG. 5.

The triangular pulse response shown in FIG. 5 can be generated by folding two square-wave pulse responses $h_3(k)$ and $h_4(k)$ of the period $\frac{1}{3} T_{a2}$ shown in FIG. 7. The amplitude of the pulse responses $h_3(k)$ and $h_4(k)$ amounts to:

$$\sqrt{\text{Amplitude}_{Dreieck}/(N/2)}$$

where Amplitude$_{Dreieck}$ (amplitude$_{triangle}$) denotes the amplitude of the pulse responses $h_1(k)$ and $h_2(k)$ (0.025 in the example) and N denotes the samples of pulse responses $h_1(k)$ and $h_2(k)$ (20 in the example).

A preferred implementation of the concept presented on the basis of FIGS. 3 through 7 for generation of the trapezoidal pulse response $h_M(k)$ will now be described in greater detail on the basis of an embodiment of filter 4 shown in FIG. 2 and the sample converter 5.

At the input 8 of filter 4, there is a multiplier 7 which multiplies the phase difference values $\phi_{diff1}(k)/\pi$ times the constant $\text{mult}_{in}$. The function of this multiplication is to compensate for the gain factor of the downstream filter stages, which is much greater than 1, so that the resulting gain factor will be 1. This multiplier can be implemented by an arithmetic shift. Only a slight gate complexity is required.

A first integrator 9 and a second integrator 10 are connected to multiplier 7. The sample converter shown in FIG. 1 is divided into two sample converters 5a and 5b in the embodiment illustrated in FIG. 2. In the first sample converter 5a, the sampling rate is first reduced by the factor $Down_{HDF}=Down_{Freq}/3=f_{a1}/3f_{a2}$. This is necessary because the square-wave pulse responses $h_3(k)$ and $h_4(k)$ shown in FIG. 7 have the period $\frac{1}{3} T_{a2}$.

A first differentiator 11 and a second differentiator 12 are connected to the first sample converter 5a. The integrator and the differentiator are followed by an averaging filter 13 which has the function of adding the output sequence of the delayed triangular pulse responses $h_1(k)$ and $h_2(k)$.

A second sample converter 5b connected to the averaging filter 13 reduces the sampling rate or the clock frequency by the remaining factor 3 to achieve a reduction in sampling rate or clock frequency by the $Down_{Freq}=f_{a1}/f_{a2}$ ratio on the whole.

In the filters, a two's complement arithmetic with a limited word length is used. The word length must be of a dimension such that there is no overflow in the second differentiator 12. There are overflows in the two integrators 9, 10 and the first differentiator 11, although they do not lead to any computation errors due to the two's complement arithmetics.

In the embodiment illustrated here, integrators 9 and 10 have the transfer function $H(z)=z/(z-1)$, differentiators 11 and 12 have the transfer function $H(z)=1-z^{-1}$, and averaging filter 13 has the transfer function $\frac{1}{2}(1+z^{-1})$.

Integrator 9 adds up the incoming phase difference values $\phi_{diff1}(k)/\pi$ endlessly in order. The respective differentiator 11 subtracts the starting value of integrator 9, which was present previously, by the interval $\frac{1}{3} T_{a2}$ (the value of integrator 9 which occurred 20 sampling times previously in the embodiment illustrated in FIG. 7) from the end value of the integration. The differentiation is thus performed over time increments of $\frac{1}{3} T_{a2}$. This is achieved by the first sample converter 5a upstream. This results on the whole in the square-wave pulse response $h_3(k)$ shown in FIG. 7.

Due to the two-step design of the series connection of two integrators 9, 10 with two differentiators 11, 12, the square-wave pulse response is generated twice ($h_3(k)$ and $h_4(k)$), and square-wave pulse responses ($h_3(k)$ and $h_4(k)$) are folded together so that the elements 9, 10, 5a, 11, 12 generate the triangular pulse response $h_1(k)$ shown in FIG. 5 on the whole. By sending the output signal of the second differentiator 12 to the averaging filter 13, there is a folding with the Dirac pulses of the pulse response of the averaging filter 13, so that the triangular pulse response $h_1(k)$ is added to the triangular sequence offset by the period $\frac{1}{3}\,T_{a2}$ (offset by 40 sampling times in the embodiment illustrated in FIGS. 5 and 6). The two overlapping triangular pulse responses $h_1(k)$ and $h_2(k)$ shown in FIGS. 5 and 6 then yield the desired resulting trapezoidal pulse response $h_M(k)$ shown in FIG. 4.

Figure 2:
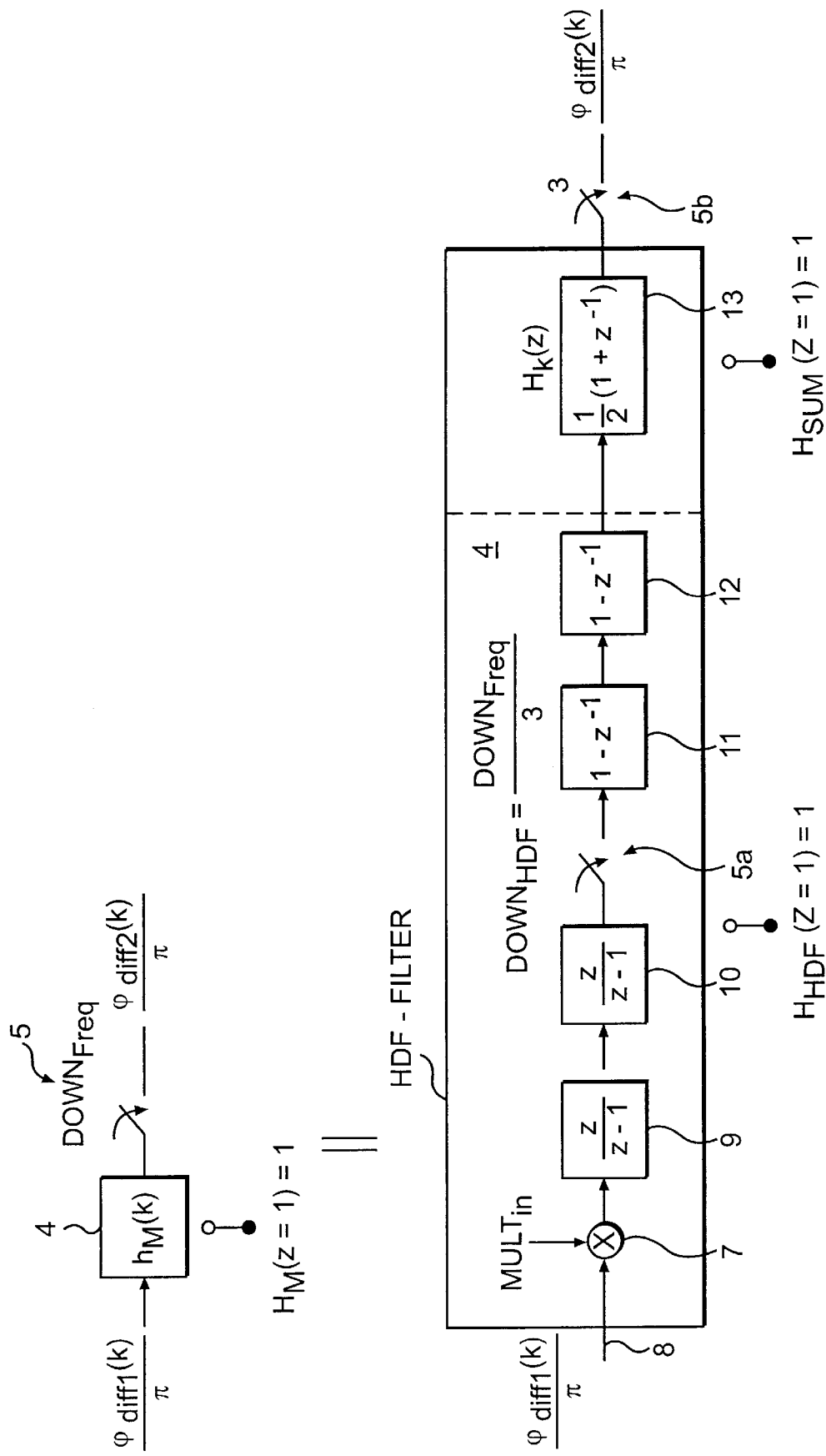
FIG. 2 is a detailed block diagram of an averaging filter of the frequency estimator according to this invention as illustrated in FIG. 1.

The block diagrams shown in FIGS. 1 and 2 serve only to illustrate one embodiment of this invention. Elements 1 through 13 are preferably implemented in the circuitry (as hardware). However, implementation in the form of program steps (as software) is also conceivable.

What is claimed is:

1. A method of estimating a frequency $\hat{f}$ of a digital input signal ($x(k)$), comprising the steps of:

determining (2) a phase ($\phi(k)=\arg(x(k))$) of the input signal ($x(k)$), generating (3) a phase difference ($\phi_{diff1}(k)$) between adjacent samples of a phase ($\phi(k)$, $\phi(k-1)$), averaging the phase difference ($\phi_{diff1}(k)$) by using a filter (4) which has a trapezoidal pulse response ($h_M(k)$), wherein the trapezoidal pulse response ($h_M(k)$) is generated by superimposing a first triangular pulse response ($h_1(k)$) on a second triangular pulse response ($h_2(k)$) which is offset in time in comparison with the first triangular pulse response ($h_1(k)$).

2. The method according to claim 1, wherein the first triangular pulse response ($h_1(k)$) is generated by folding two square-wave pulse responses ($h_3(k)$, $h_4(k)$).

3. The method according to claim 2, wherein the second triangular pulse response ($h_2(k)$) is generated by folding the first triangular pulse responses ($h_1(k)$).

4. The method according to claim 3, wherein the square-wave pulse responses ($h_3(k)$, $h_4(k)$) are generated by integration (9, 10) and subsequent differentiation (11, 12), where a sampling rate ($f_{a1}$) is reduced between integration (9) and differentiation (11) to one third of the inverse of the period ($f_{a1}=\frac{1}{3}\cdot 1/T_{a2}$) of the trapezoidal pulse response ($h_M(k)$) of the filter (4).

5. The method according to claim 4, wherein the square-wave pulse responses ($h_3(k)$, $h_4(k)$) are folded by performing the integration (9, 10) and differentiation (11, 12) each in two stages.

6. A device for estimating the frequency ($\hat{f}$) of a digital input signal ($x(k)$), comprising:

a phase determination device (2) for determining a phase ($\phi(k)=\arg(x(k))$) of the input signal ($x(k)$), a differentiator (3) for generating a phase difference ($\phi_{diff1}(k)$) between adjacent samples of a phase ($\phi(k)$, $\phi(k-1)$), a filter (4) which has a trapezoidal pulse response ($h_M(k)$) and averages the phase difference ($\phi_{diff}(k)$), wherein the filter (4) has a first integrator (9), a second integrator (10) downstream from the first integrator (9), a sample converter (5a) downstream from the second integrator (10), a first differentiator (11) downstream from the sample converter (5a), a second differentiator (12) downstream from the first differentiator (11), and an averaging filter (13) downstream from the second differentiator (12).

7. The device according to claim 6, wherein a sampling rate ($f_{a1}$) is reduced in the sample converter (5a) to one third of the inverse of the period ($f_{a1}=\frac{1}{3}\cdot 1/T_{a2}$) of the trapezoidal pulse response ($h_M(k)$) of the filter (4).

8. The device according to claim 6, wherein a transfer function $H_K(Z)$ of the averaging filter (13) amounts to:

$$H_K(Z)=\tfrac{1}{2}(1+Z^{-1}).$$

* * * * *